United States Patent
Vernackt

(10) Patent No.: US 6,804,388 B2
(45) Date of Patent: Oct. 12, 2004

(54) METHOD AND APPARATUS OF REGISTERING A PRINTED CIRCUIT BOARD

(75) Inventor: Marc Vernackt, Overmere (BE)

(73) Assignee: ManiaBarco, Inc., South Windsor, CT (US)

( * ) Notice: Subject to any disclaimer, the term of this patent is extended or adjusted under 35 U.S.C. 154(b) by 630 days.

(21) Appl. No.: 09/808,730

(22) Filed: Mar. 14, 2001

(65) Prior Publication Data

US 2002/0131632 A1 Sep. 19, 2002

(51) Int. Cl.[7] ................................................. G06K 9/00
(52) U.S. Cl. .......................................... 382/151; 348/87
(58) Field of Search ................................. 382/151, 145, 382/147; 348/87, 95; 250/559.3, 559.29; 356/614

(56) References Cited

U.S. PATENT DOCUMENTS

| | | | | |
|---|---|---|---|---|
| 4,745,289 A | * | 5/1988 | Mashima | 250/548 |
| 4,793,052 A | * | 12/1988 | Ammann et al. | 29/559 |
| 5,185,055 A | * | 2/1993 | Temple et al. | 216/40 |
| 5,206,820 A | * | 4/1993 | Ammann et al. | 702/185 |
| 5,835,223 A | * | 11/1998 | Zwemer et al. | 356/600 |
| 5,928,772 A | * | 7/1999 | Shiraishi et al. | 428/297.4 |
| 6,000,124 A | * | 12/1999 | Saito et al. | 29/830 |
| 6,072,898 A | * | 6/2000 | Beaty et al. | 382/146 |

* cited by examiner

Primary Examiner—Bhavesh M. Mehta
Assistant Examiner—John Strege
(74) Attorney, Agent, or Firm—Dov Rosenfeld; Inventek

(57) ABSTRACT

An apparatus and method of registering a panel is disclosed. The panel is held in a frame. The frame includes a transparent plate that covers the panel. The transparent plate has a pattern on at least one surface. Next, an image of each one of a number of registration targets on the surface of the panel is received. The image is received through the transparent panel. The actual location of each one of the registration targets relative to the pattern is then determined.

8 Claims, 13 Drawing Sheets

METHOD AND APPARATUS OF REGISTERING A PRINTED CIRCUIT BOARD

FIELD OF THE INVENTION

The present invention relates to alignment systems and more specifically to an automated method of handling and processing printed circuit board panels, printing plates, or other sensitized sheets.

BACKGROUND

It is known today that printed circuit boards may be composed of several PCB panels, each panel having two sides, one or more of which is provided with a layer forming an electrical circuit. When there is only one panel having only two layers, the board is commonly called a double-sided board, and when there are more than two layers, the board is commonly called a multi-layer board. A common way of manufacturing a multi-layer board is by fixing several panels together, each panel having a single printed circuit on one side, or a circuit on each side. "Outer" panels are those that face the outside of a multi-layer PCB, and "inner panels" are the interior panels. Typically, the inner panels have a circuit on both sides, while the outer panels have a circuit only on one, the outer side.

Each inner panel resembles a thin double-sided PCB in that the panel is comprised of an insulating substrate, which is clad on both sides with metallic foil, typically copper foil. A printed circuit is formed on any circuit side of an inner panel by that side's metal cladding having a light-sensitive layer laid on top of the metal. The light-sensitive layer is exposed to light (typically ultra-violet (UV) radiation) at selected locations, then processed by a photographic process that removes the layer at selected locations. An etching process is then applied to remove those parts of the layer of metallic foil not necessary for forming the actual circuit. Once all the double-sided inner panels are produced, they are fused (pressed) together by placing an insulating binding material, typically a partially cured epoxy-resin material called prepreg, between the panels. Unexposed outer foils are placed on the outside of the double-sided inner panels, again with prepreg in between. All the layers are now laminated by applying heat and pressure that causes the prepreg to flow and bond to the surfaces of the inner panels and the outer foils. Holes are now drilled on the laminated multi-layer board, including holes for mounting electrical components inserted into the board ("mounting holes"), and holes for making contacts from one layer to one or more other layers (feed-throughs, also called vias or conductive vias). The holes typically are plated through. Each side of the multi-layer panel now is sensitized, then exposed and processed to form the two outer printed circuits in exactly the same manner as forming circuits on the inner panels.

Since a multi-layer panel is exposed in the same way as an inner PCB panel, the words "PCB panel" or simply panel will mean either a complete PCB board, an inner PCB panel, or a post-lamination multi-layer panel.

One difficulty in producing multi-layered printed circuit boards is the strict requirement for accuracy in positioning the different PCB panels together to ensure that the different circuits are positioned very accurately relative to each other. In particular, mounting holes and vias need to be very accurately placed on each layer's circuits. For a particular tolerance for the placement of a circuit, it is clear that any deviations in the specified location of each layer's circuit may be additive, so that at any one location, there could be large deviations. For the case of double-sided panels, including a multi-layer panel after lamination, it is even more difficult to position the circuits accurately enough relative to each other.

New technology for making PCB panels, like sequential build up (SBU) or direct ablation of the copper can be used with direct imaging technology. See below for a discussion of direct imaging. For technologies such as SBU, where each new layer is directly added to the previous stack of layers as an additive process, the relationship between the imaging process and the registration process becomes very critical so that the registration imaging processes need to interact more closely. This relationship between the imaging and registration processes becomes increasingly critical as the geometrical accuracy and PCB layout density is increased. Further, to maintain the registration accuracy through the imaging process, the registration apparatus must be accurately mated to the imaging apparatus as the need for accuracy increases.

A common method for producing printed circuit boards is to first produce artwork, which is an accurately scaled configuration used to produce a master pattern of a printed circuit. Artwork is generally prepared at an enlarged scale using various width tapes and special shapes to represent conductors. The items of artwork, once reduced, for example, by a camera onto film to the correct final size, are referred to as phototools and are used as masks for exposing the sensitized layers. Because the photographic reduction is never 100 percent accurate, more accurate phototools are produced nowadays using photoplotters rather than photographic reduction.

However produced, physical phototools are susceptible to damage and distortion. In addition, whenever any amendments need to be made to any circuit, new phototools need to be produced. Furthermore phototools, sometimes in the form of photographic negatives, are difficult to store. They also may not be stable; their characteristics might change with temperature and humidity changes and can suffer degraded quality over time. Some changes include image degradation, localized or global shrinkage or expansion.

There thus are advantages to directly imaging the required circuit patterns onto PCB panels, for example PCB panels that include a light-sensitive layer on one or both sides. The same advantage also is applicable to directly imaging printing plates that include a UV, visible light, or thermally-sensitive layer. Often such sensitive sheets as used for PCBs or thermal printing plates are rigid, so that the scanning apparatus for exposing such sheets for direct imaging (e.g., directly exposing printing plates or directly exposing PCB panels) is of the flat-bed type in which the sheet is disposed on a horizontal table for exposure by the light energy (e.g., UV light or infrared) produced by the scanner. Such scanning apparatuses are typically quite bulky because of the horizontal table. Also, such direct imaging systems expose one side at a time, and there are problems accurately aligning the two sides for double-sided exposure.

Direct imaging addresses some of the production issues such as the difficulties associated with photoplotters, phototools, and the image transfer process. Direct imaging, however, does not ensure proper alignment of the PCB panel to be processed, especially with outer layers where the image must match the drilled holes pattern. In a typical direct imaging process, a first PCB panel is imaged at a nominal 100% scale. Then the imaged first PCB panel is drilled. The imaged and drilled first PCB panel is then registered for a subsequent layer to be added. The entire image of the subsequent layer is scaled as determined in the registration of the imaged and drilled first PCB panel.

Further, direct imaging, alone, does not address the handling of the PCB panels. Modern PCB panels can be large scale such as up to 24 inches in width and up to 36 inches in length (609.6 mm×914.4 mm) or even larger PCB panels are know to be used.

The manufacturing difficulties of precise alignment and handling described above are further amplified as the overall physical size of the PCB panel increases and/or as PCB circuit density increases (e.g., line widths get smaller and closer together). In many specialized applications the PCB panel can be a large scale PCB panel—as large as 24 inches in width and 36 inches in length (609.6 mm×914.4 mm) or even larger. Large-scale sizes are more difficult to handle and accurately align for processing than more typical, smaller PCB panels. The result is a very slow, complicated and expensive production process that typically results in inconsistent product quality.

Thus there is a need for an automated method for precisely handling and aligning a pattern, for example, a drilled holes pattern, and for direct imaging both sides of a large scale PCB panel to produce a consistently high quality product at a low cost and high rate of production. Further, such a process should include the capability of handling large as well as small size PCB panels. To handle both large and small PCB panels requires that registration targets such special target shapes or drilled holes patterns are located at a wide variety of locations. Further, the wide variety of locations of registration targets requires fast, accurate, flexible registration process and apparatus that the typical fixed camera and encoder/track camera apparatus either cannot provide or would be very expensive to provide. Also, mixing to-be-imaged panels of varying sizes and thicknesses should happen dynamically and automatically without operator input or introducing unnecessary delays, and should provide the operator with total production flexibility.

Another problem with traditional PCB panels is that the misalignment may be localized. Because traditional PCB panels are assembled using phototools as described above, one portion of a PCB panel may be slightly out of scale or distorted, resulting in a localized misalignment that is limited to only the distorted portion of the PCB panel.

One method to resolve the above-described panel alignment issues uses a complex, expensive visual registration system. One such prior-art visual registration system is illustrated in FIG. 1 and includes a first frame 130 to mount a first PCB panel 100 in a known position and a second frame 140 to mount a second (or subsequent) PCB 120 panel therein. The visual registration system also includes an alignment mechanism 150 for aligning the frame 140 in the X-axis and Y-axis as well as any rotation 152 error ("delta theta" rotation error). The visual registration system also includes several cameras 160, 162, 164. Each of the cameras 160, 162, 164 is mounted on camera tracks 170, 171, 172, 174, 175 so that each of the cameras 160, 162, 164 can be moved to visually capture ("see") an assigned registration target 180, 182, 184 respectively, on the second PCB panel 120. The registration targets 180, 182, 184 are illustrated as separate elements such as cross marks or drilled holes. The registration targets 180, 182, 184 can also be elements of the circuit on the second PCB panel 120. The camera tracks 170, 171, 172, 174, 175 must be very stable and firm so that the camera locations relative to the second frame 140 are known to a very small tolerance.

For one version, very precise and thus expensive encoders and possibly translation stages are included in the camera tracks 170, 171, 172, 174, 175. The encoders accurately determine the locations of cameras 160, 162, 164 along camera tracks 170, 171, 172, 174, 175. Each of the cameras 160, 162, 164 is moved along the tracks 170, 171, 172, 174, 175 to focus and center on the assigned registration target 180, 182, 184 respectively. Because the locations of the cameras 160, 162, 164 are known, and the cameras 160, 162, 164 are focused and centered on the respectively assigned registration targets 180, 182, 184, then the location of the registration targets 180, 182, 184 relative to the second frame 140 can be determined.

For example, determining the location of the three registration targets 180, 182, 184 in two dimensions (X-axis and Y-axis), identifies the location of the second PCB panel 120 relative to the second frame 140. If the location of the registration targets 180, 182, 184 relative to the circuit on the second PCB panel 120 are known, then the location of the circuit on the second PCB panel 120 is known. Once the location of the circuit on the second PCB 120 is known, then the second frame 140 can be adjusted with the alignment mechanism 150 until the registration targets 180, 182, 184 on the second PCB panel 120 are aligned with the corresponding registration targets 190, 192, 194 on the first PCB panel 100. Then the two PCB panels 100, 120 can be brought together for bonding and subsequent drilling, electrical connecting or other processing. The visual registration system described in FIG. 1 can also be used to accurately align a single PCB panel, such as the second PCB panel 120, for a sequential build-up (SBU) process.

The prior-art visual registration system described in FIG. 1 is complicated, requiring multiple moving cameras. The system is also expensive, requiring highly precise tracks and encoders. The prior-art visual registration system is also unable to compensate for a localized distortion of a previously assembled PCB panel. Further, the prior-art visual registration system is also unable to quickly locate a large number (such as 25 or more) of registration targets.

SUMMARY OF THE INVENTION

A method of registering panel is disclosed. First, the panel is held in a frame. The frame includes a transparent plate that covers the panel. The transparent plate has a pattern on at least one surface. Next, an image of each one of a number of registration targets on the surface of the panel is received. The image is received through the transparent panel. The actual location of each one of the registration targets relative to the pattern is then determined.

Locating the registration targets by comparison to the grid elements provides significant advantages over the prior-art methods that rely on moving cameras. Relying on the comparison of the pattern and the registration targets eliminates moving parts and provides simpler, less expensive registration engine components without reducing the accuracy of the results. In addition, interposing the pattern over the registration targets allows compensation for localized deformations.

A system for registering a panel is also disclosed. The system includes a frame for detachably supporting the panel. A transparent plate is mounted on the frame. The transparent plate covers the panel and includes a pattern on at least one surface. A vision system is also mounted on the frame such that the vision system can see the panel through the transparent plate.

BRIEF DESCRIPTION OF THE DRAWINGS

The present invention is illustrated by way of example and not limitation in the figures of the accompanying drawings in which like references indicate similar elements.

FIG. 7 illustrates examples of types of distortion that can be compensated for.

DETAILED DESCRIPTION

As will be described in more detail below, a system and method of visually registering a panel is described. The system can be used to register panels of many varying sizes and thicknesses. One embodiment of the described system requires fewer cameras and more simplified camera operation than prior-art registration systems. The described system can also measure a localized distortion or misalignment.

One embodiment of a registration process is a process of aligning a panel for processing. In the registration process, three or more registration targets are first located by a visual registration engine, then the panel is adjusted until the three or more registration targets are aligned according to the corresponding assigned locations. Alternatively, the panel can be registered in a two step registration process. First the panel is registered in a coarse registration process where at least two registration targets are used. Next, three or more registration targets are aligned as described above.

Figure 2A:
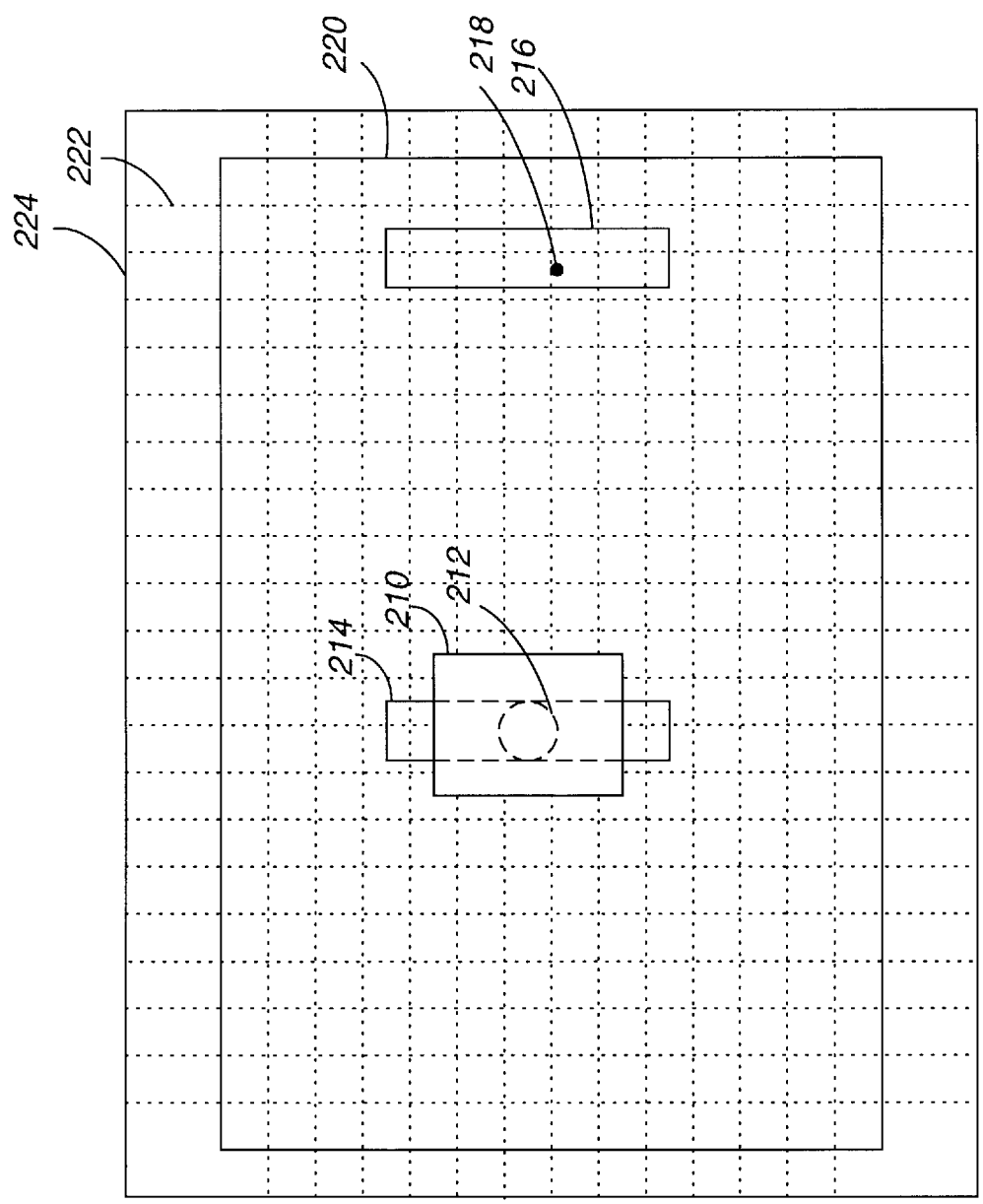
FIG. 2A shows a "top" view of one embodiment of a registration engine.
Figure 2B:
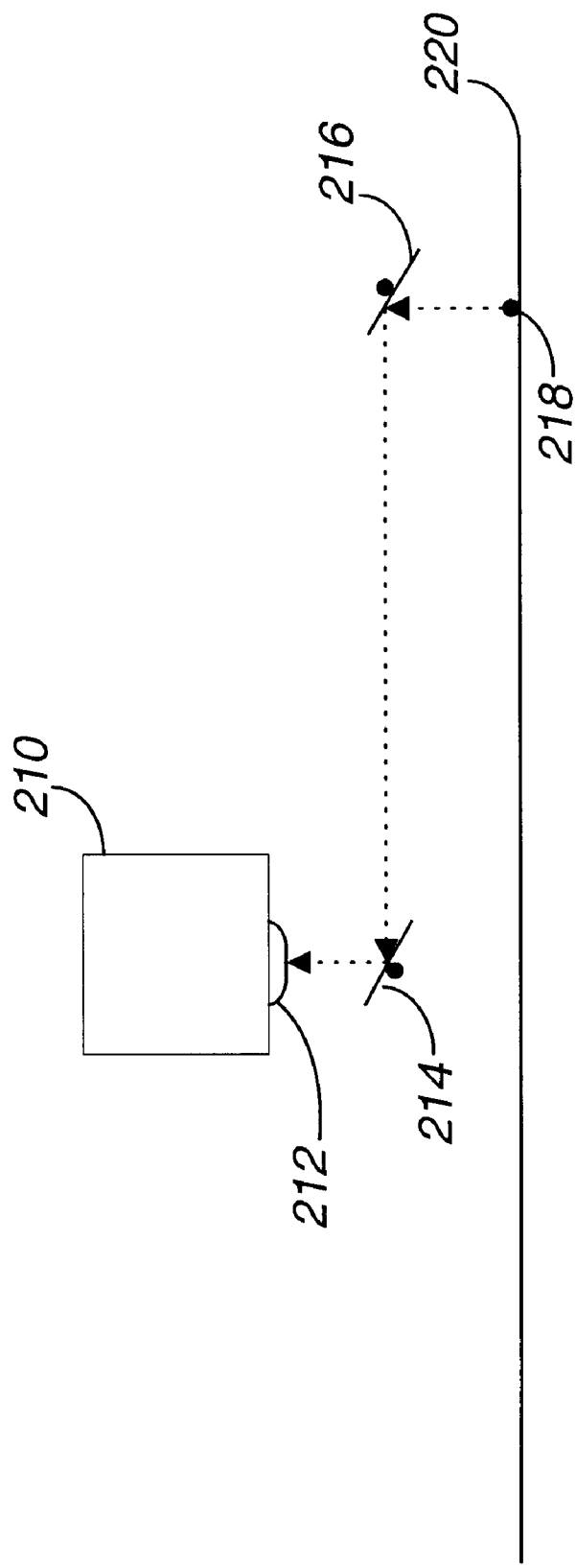
FIG. 2B shows a side view of the registration engine shown in FIG. 2A.

One embodiment of a registration engine is shown in FIGS. 2A and 2B. FIG. 2A shows a "top" view of one embodiment. FIG. 2B shows a side view of the same embodiment. The reference to the views shown in FIGS. 2A and 2B as "top" and "side" views is for ease or reference only and are not intended to limit the actual orientation of the described embodiment. Camera 210 includes a lens 212 and views a registration target 218 on panel 220, through mirrors 214, 216.

Mirrors 214, 216 are mounted on pivots so that the mirrors 214, 216 can be rotated. In one embodiment, the pivots of mirrors 214, 216 are each connected to a stepper motor. The stepper motors provide very accurate rotation of the mirrors 214, 216 which allows the mirrors 214, 216 to cover a large area of the panel 220. Alternatively, mirrors 214, 216 and camera 210 can be mounted on tracks. A track would allow the mirrors 214, 216 and camera 210 to move laterally left and right, as shown. The tracks can include an encoder to provide accurate location of the mirrors 214, 216 and camera 210 at any point along the track. Alternatively, a simpler, less complicated and less expensive track can include a limited number of predefined locations so that the mirrors 214, 216 and camera 210 are moved from one known location to another. In either embodiment, rotating mirrors 214, 216 or mirrors 214, 216 and camera 210 on tracks, or combinations thereof, the mirrors 214, 216 can be adjusted to accurately reflect an image of the registration target 218 on the panel 220 to the camera 210. The precise location of the registration target 218 can then be accurately determined.

In an alternate embodiment also shown FIG. 2A, a pattern 222 is superimposed over panel 220. The size and shape of the pattern 222 are illustrated in a dashed line, square-block form for simplicity reasons only. The pattern 222 is not intended to be limited to only dashed lines or square dimensions or even a grid shape. The pattern 222 could be any shape or form such as solid or dashed lines, triangles, diamonds, diagonal lines, circles, curves, etc. As will be described in more detail below, any constant pattern can be used as the pattern 222. The physical dimensions of the spaces between the lines of the pattern 222 is determined by the resolution of the camera 210.

The locations of the grid elements (i.e. line intersections and line features) of the pattern 222 are known and therefore the image of the registration target 218 can be compared to the known location of the grid elements and a precise location of the registration target 218 can be determined. The location of the grid elements are used to determine the precise location of the registration target 218. Locating the registration target 218 by comparison to the grid elements provides significant advantages over the prior art shown in FIG. 1. The prior-art method relies on the camera 160 being physically moved and precisely centered on the registration target 180 and the location of the registration target 180 is thereby determined from the location of the camera 160. Relying on the comparison of the grid elements and the registration target 218 allows use of a simpler, less expensive, less precise registration engine components without reducing the accuracy of the results. Thus the registration process becomes one of comparing the location of a registration target 218 to a known reference, the pattern 222. For one embodiment, the first step in the registration process is to obtain an image containing the registration target 218 and a portion of the pattern 222. Next, analyze the image of the registration target 218 and the portion of the pattern 222 and calculate the precise location of the registration target 218. For one embodiment, analyzing the image can be accomplished while a second image of a second registration target is being obtained.

The accuracy of precisely locating the registration target 218 is determined by the fixed pattern 222, rather than a moving camera 160. This removes several moving parts from the system and thereby increases the speed, reliability and durability of the registration engine. Further, since the registration engine can more quickly locate registration targets, then multiple registration targets can be located in a very short time span. As more registration targets are precisely located then, as will be described in more detail below, the panel and or the subsequent imaging of the panel can be more accurately adjusted.

The elements of the pattern 222 can include reference points and identification marks such as letters, numbers, or other graphic patterns so that each area of the pattern 222 is unique. For example, one line in the pattern 222 may be a line of very small letter "A's". The lines intersecting the "A" line are each individually lines of one number, respectfully so that a magnified view of one such intersection would show a line of "A's" being intersected by a line of "6's". Therefore, such an intersection of "line A" and "line 6" would only occur in one location in the pattern 222. For an alternative embodiment, the lines in the pattern 222 can be differentiated by the approximate location of the image based on the location and angle of the camera and mirrors that are receiving the image. For one embodiment, any imperfections and irregularities such as curving lines or lines with gaps in the pattern 222 can be ignored since the pattern 222 is constant from one panel 220 to a next panel. For one embodiment, a correction table is created to correct for any such irregularities, thus allowing simple and inexpensive construction techniques to create the pattern 222.

For another embodiment, the camera 210 can go to a "home" location when the system is initialized. The camera 210 can then be moved or directed to locate a registration target 218. As the camera 210 is moved or directed, the grid lines passed can be counted and the camera 210 location or direction (i.e. angle the camera is directed in) can thereby be determined.

The pattern 222 in one embodiment is located on the surface of a transparent plate 224 located between the camera 210 and the panel 220. For one embodiment, the pattern 222 is located on the first surface of the transparent plate 224. The first surface of the transparent plate 224 is adjacent to the panel 220 so that the pattern 222 is very close to the registration target 218 on the panel 220. Locating the pattern 222 adjacent to the panel 220 substantially eliminates any error caused by viewing the registration target 218 and the pattern 222 at an angle.

For another embodiment, the pattern 222 can be projected upon the transparent plate 224 with one or more lasers. For one embodiment, the lasers forming the grid can be color coded (i.e. different wavelengths) for each line and column or sequences of lines and columns. For example, a first laser of a first wavelength projects a first line, a second laser of a second wavelength projects a second line, a third laser of a third wavelength projects a third line and so forth for subsequent lines and columns. Individual pattern elements can be determined by the intersections of lines and columns of different wavelength lasers. The lasers for projecting the pattern 222 can be located on the perimeter of the transparent plate 224. For one embodiment, the laser projected pattern 222 could be projected within the transparent plate. For another embodiment, the pattern 222 could be projected from above the transparent plate, through the transparent plate 224 to the panel 220.

Figure 2C:
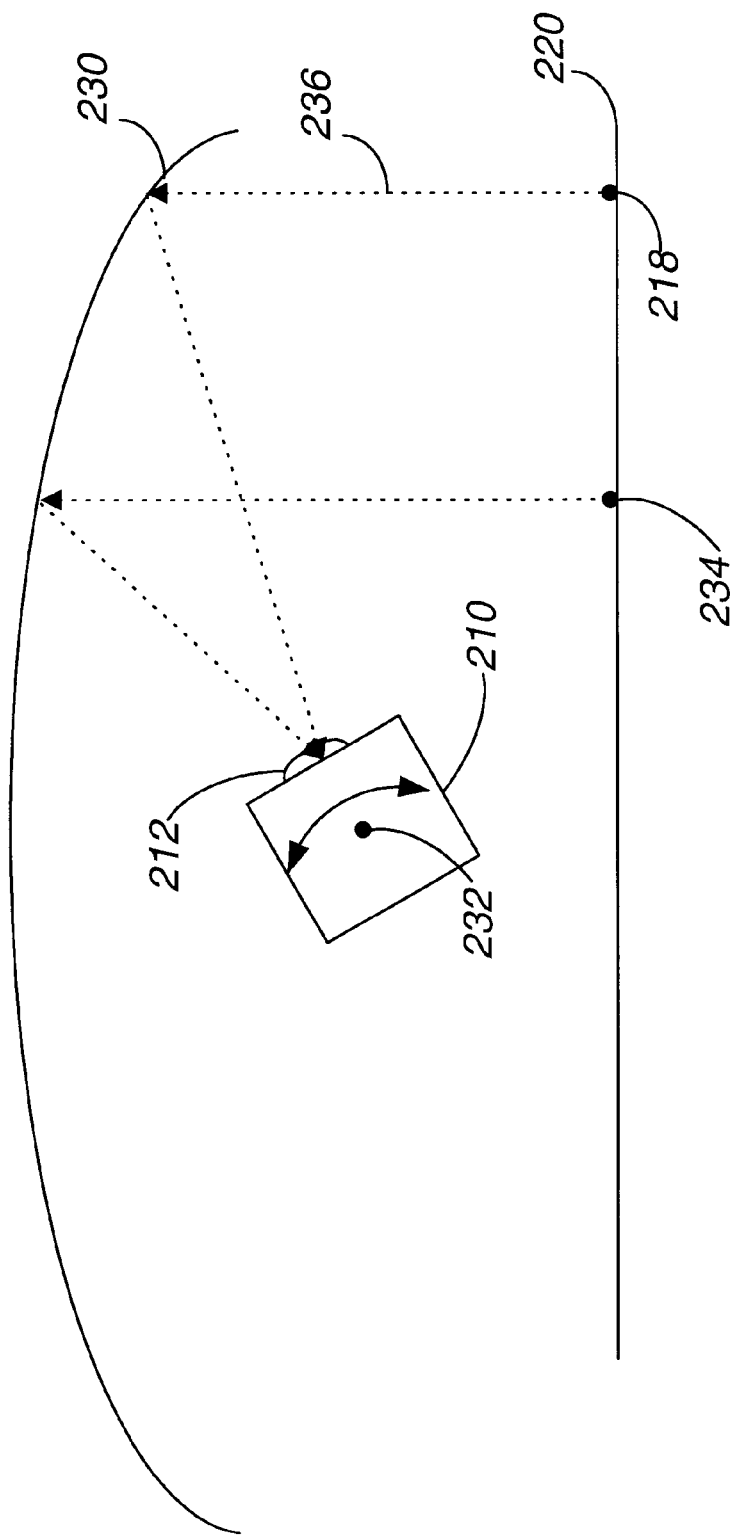
FIG. 2C shows an alternative embodiment of a registration engine with a single parabolic mirror.

Another alternative embodiment is shown in FIG. 2C. A single, three-dimensional, parabolic mirror 230 replaces mirrors 214, 216. The camera 210 is reversed and located such that the lens 212 is at the focal point of the mirror 230. Because the lens 212 is at the focal point of the mirror 230, then the camera 210 receives a perpendicular reflection of the panel 220. A reflection 236 of the registration target 218 is received in the camera 210. The parabolic mirror 230 allows the camera 210 to view a very large area of the panel 220. Alternatively, the mirror 230 could be a simple concave mirror. In still another alternative, the camera 210 is mounted on a pivot 232 so that the camera 210 can be rotated to view a larger portion of the panel 220. Rotating the camera 210 allows the camera 210 to receive a reflection a registration target 234 located directly perpendicularly between the camera 210 and the panel 220.

Using a perpendicular reflection 236, the registration targets 234, 218 allows the pattern 222 to be located on a second surface such as on a transparent plate 224 placed between the panel 220 and the camera 210. Because the image of the registration targets 234, 218 is reflected perpendicularly to the camera 210, then the pattern 222 can be located on the second surface of the transparent plate 224, which is offset from the panel 220.

The transparent plate 224 can be made of any transparent material that has stable thermal properties. Examples of suitable materials for the transparent plate 224 include glass, various plastic and thermoplastic materials such as polycarbonate. The pattern 222 may be formed on the transparent plate 224 in any one of several methods known in the art. Some methods include but are not limited to: printing by photo-offset techniques or direct imaging and etching, or as a film applied to a surface of the transparent plate 224, or any other suitable method. Any film used must have very stable properties across a broad range of temperatures and humidity. An example of a very stable film is a dry film such as Master Tool™ brand film from the Agfa-Gevaert Group or similar films available from Minnesota Mining and Manufacturing (3M) Company and other sources. Other suitable materials can also be used to form pattern 222 on the transparent plate 224. The transparent plate 224 must be at least as large as the largest panel 220 to be accommodated by the registration engine.

Figure 2D:
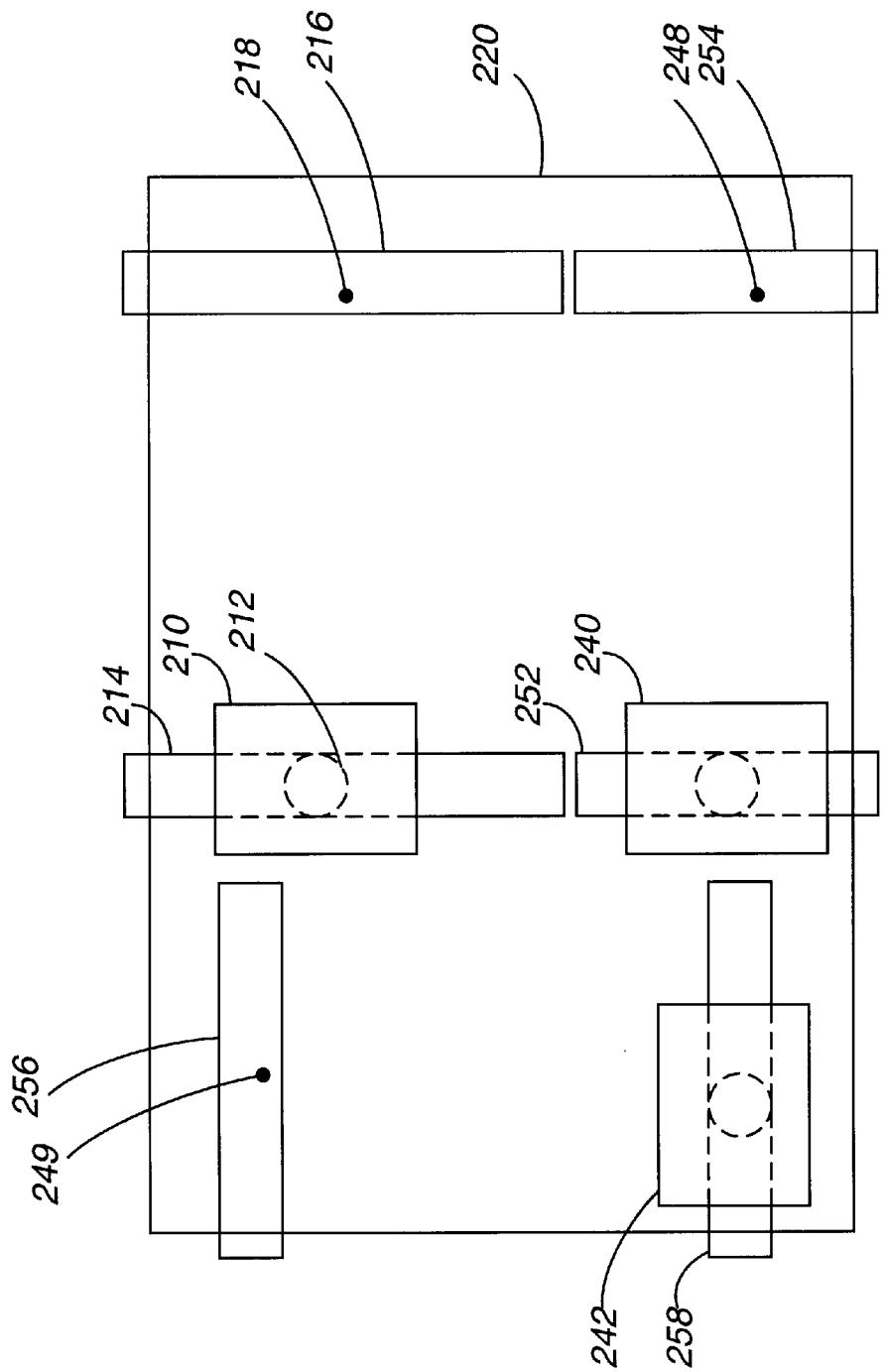
FIG. 2D shows an alternative embodiment of a registration engine with multiple cameras.

In an alternate embodiment shown in FIG. 2D, multiple cameras 210, 240, 242 can be used to cover various sections of the panel 220. As shown camera 242 and mirror 252, 254 can be oriented in an alternate orientation from camera 210 and mirrors 214, 216. Using multiple cameras 210, 240, 242 allows the registration engine to handle a broad range of multiple varying sizes of panels 220 and still be capable of accurately locating the appropriate registration targets 218, 248, 249. Using multiple cameras 210, 240, 242 also allows the registration engine to obtain images of multiple registration targets simultaneously to further increase the registration process speed. The sizes of panels 220 that can be accommodated are limited only by the area that cameras 210, 240, 242 can accurately cover. For example, current panel 220 sizes vary from 6 inches in width and 6 inches in length (152.4 mm×152.4 mm) to 24 inches in width and 36 inches in length (609.6 mm×914.4 mm) or even larger. A conventional visual registration system requires larger, more expensive encoders to handle a very broad range of panel 220 sizes. Further, conventional visual registration systems require very stable and expensive frames such as a precision granite base.

Figure 3:
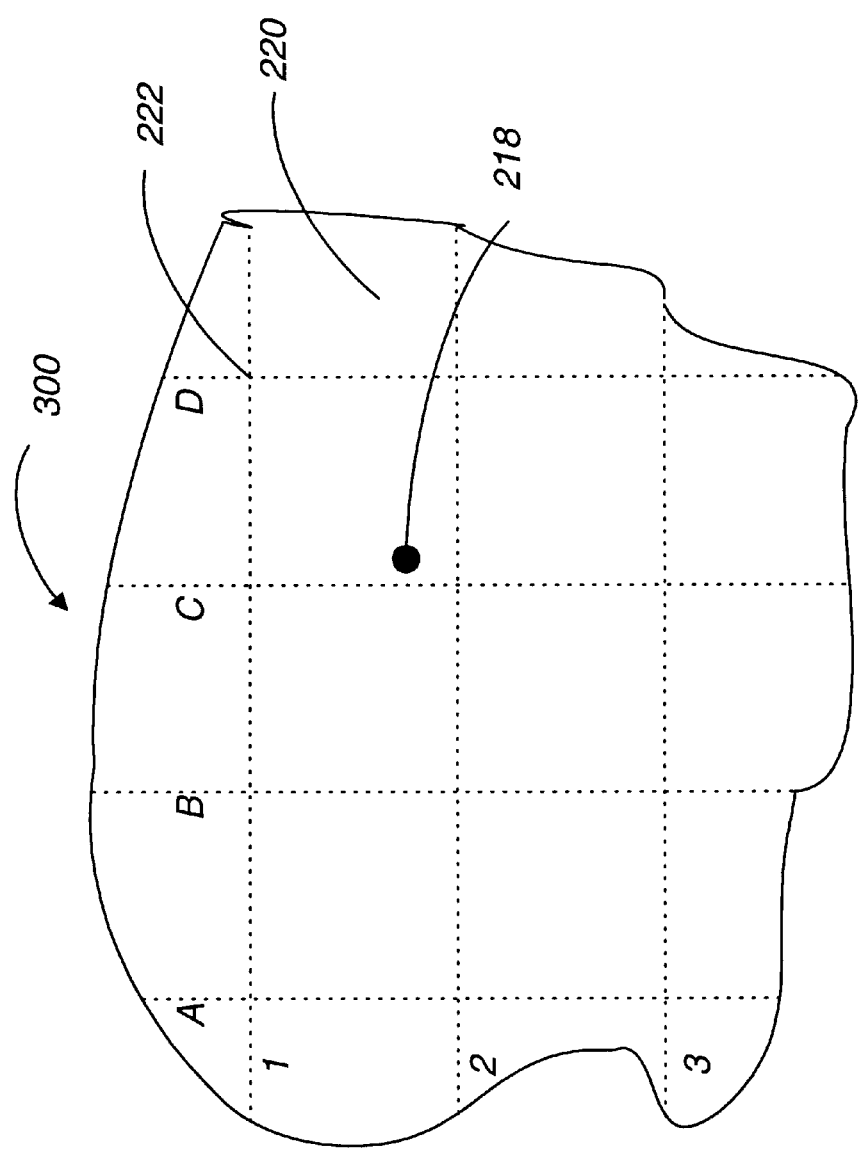
FIG. 3 illustrates a portion of an image of a registration target.

FIG. 3 illustrates a portion of an image 300 of a registration target 218 on the panel 220. The registration target 218 is shown located very close to the intersection of line C and line 2. The image 300 is converted to bitmap or similar computer readable graphic data format that can be analyzed by a suitable computer image processing software. A computer processes the image 300 to determine the precise distance and orientation between the registration target 218 and line C and line 2 to determine the precise location of the registration target 218 relative to the pattern 222. As will be described in more detail below, once the precise location of the registration target 218 is determined, then the computer can automatically adjust the position of the panel 220 until the registration target 218 is in the correct location for subsequent processing. The images of the any number of registration targets such as registration targets 248, 249 can be similarly processed and the position of the panel 220 adjusted accordingly.

Figure 4A:
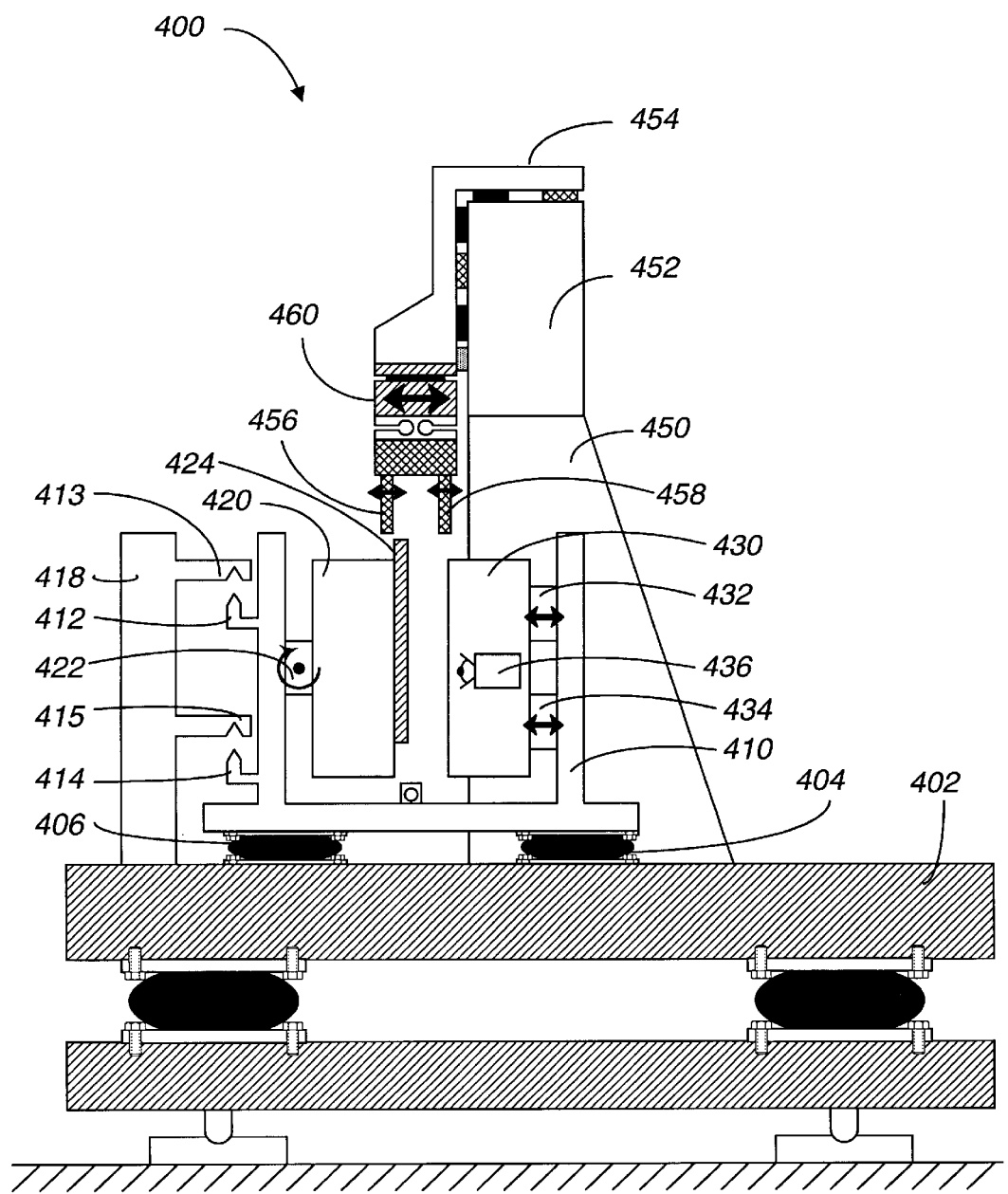
FIG. 4A illustrates one embodiment of the registration section.

FIG. 4A illustrates one embodiment of the registration section 400 of a larger system such as described in FIG. 5 below. The registration section 400 includes a foundation slab 402. The vibration isolators 404, 406 are mounted to the foundation slab 402 and are operable to isolate the registration sub frame 410 from the foundation slab 402. Isolating the registration sub frame 410 from the foundation slab 402 substantially eliminates the transmission of vibrations from the registration engine 400 to any adjoining sections of a larger system. For example, a subsequent section could be an imaging section and could be imaging a previous panel in parallel with the current panel's 424 registration. The isolators 404, 406 can be air bellows or other viscous couplings capable of isolating the registration sub frame 410 from the foundation slab 402. Such viscous couplings can also include oil or water filled couplings or combinations thereof or any equivalents thereof.

Docking or guide pins 412, 414 are mounted on the registration sub frame 410. Pin recesses or guide pin sockets 413, 415 are mounted to a portion 418 of the frame for the image section. The use of a combination of self-centering docking pins 412, 414 and pin recesses 413, 415 are but one embodiment. Alternatives include precision channels and grooves or other equivalent mechanical, self-centering devices and a docking surface with a corresponding mating surface in lieu of the docking pins 412, 414 and pin recesses 413, 415. The registration sub frame 410 is docked to the portion 418 of the frame for the image section by raising or otherwise inflating the isolators 404, 406 so as to cause the entire registration sub frame 410 to move upwards. At a certain level, where the docking pins 412, 414 engage the pin recesses 413, 415, the registration sub frame 410 will enter into a repeatably accurate position. In an alternative embodiment, the registration sub frame 410 does not move to undock or disengage from the remaining sections of a larger system. The vibration isolators 404, 406 can also be optional in alternative embodiments although such alternative embodiments would likely be slower so as to not load a panel 424 into the registration engine 400 at the same time another panel is being processed in the remaining sections of the larger system. Such an alternative embodiment would therefore be substantially slower than the embodiment having some method of isolation between the registration section 400 and the imaging section but would provide the benefit of a simpler apparatus.

A vacuum table 420 is attached to the registration sub frame 410 via a pivot 422. See for example, U.S. patent application Ser. No. 09/447,184 to Vernackt filed Nov. 22, 1999, entitled AUTOMATICALLY ADAPTING VACUUM HOLDER, and assigned to the assignee of the present invention, for an example of a vacuum table that may be used in the present invention. Other types of vacuum tables may also be used. A panel 424 is shown being held by the vacuum table 420. A transparent panel 430 is attached to the registration sub frame 410 via a plurality of extenders 432, 434. Multiple cameras 436 (only one shown) are attached to the transparent panel 430 as described above in FIGS. 2A–2D. A portion of the vertical support 450 and top rail 452 for the image section are also shown. An exposing carriage 454 is slideably attached to the top rail 452. Multiple panel grippers 456, 458 are attached to the exposing carriage 454 via multiple lateral adjusters 460. In one embodiment, the transparent plate 430 has a pattern and a plurality of cameras 436, as described above in FIGS. 2A–2D, to accurately and quickly measure the position of a plurality of registration targets which are located on the panel 424.

Before the transfer of the panel 424 to the registration section 400, the registration section 400 is checked to ensure the registration section 400 is ready to accept a new panel i.e. does not have a panel currently in the registration section 400. In another embodiment, before a panel flipper returns to "home" position in a preceding section such as a panel loading zone, the push plate (not shown) is retracted. Retracting the push plate provides the possibility to move the panel flipper backwards, with the panel hanging vertically on the vacuum table 420. In an alternative embodiment, the push plate can be part of the panel flipper. If the push plate is part of the panel flipper, the transparent plate 430 is not needed. In still another embodiment where the loading section includes a first vacuum table, the same first vacuum table can serve as the push plate, which is thus part of the panel flipper. The use of such a first vacuum table has the advantage that the panel 424 is flattened during the load process and a flat panel 424 is presented to the vacuum table 420 in the registration section. In another alternative embodiment, the push plate can also be the transparent plate 224 as shown in FIG. 2A.

Also after the panel 424 is brought in front of the vacuum table 420, first compressed air is applied to create an air flow escaping from both the vacuum table 420 and the plate 430. The air flow creates an air cushion or air bearing when the plate 430 comes towards the vacuum table 420. In this method the panel 424 is sandwiched between the vacuum table 420 and the plate 430. The low friction of the air cushion assists in flattening the panel 424 without damaging the panel 424 during the sandwich operation. Next, the airflow in the vacuum table 420 is stopped and vacuum is applied. For a short period of time, compressed air is escaping from the plate 430. The vacuum causes the panel 424 to be fixed onto the vacuum table 420. Next, the grippers of the panel flipper release the panel. In an embodiment where the plate 430 is part of the registration section 400, the plate 430 is retracted. Then the panel flipper can then return to the loading section to pick-up the next panel. In one embodiment, the plate 430 includes a granular surface so that the compressed air flow between the plate 430 and the panel 424 is substantially uniform. For one embodiment, the granular surface on the plate 430 is an etched pattern such as the pattern 222 shown in FIGS. 2A and 3.

When a panel 424 is loaded into the registration section 400, the vacuum table 420 applies a vacuum to the panel 424 to securely hold the panel 424. Next, the transparent plate 430 is pressed against the panel 424 via the extenders 432, 434. Pressing the panel 424 against the vacuum table 420 with the transparent plate 430 results in a very tight sandwich-type structure. The sandwich-type structure flattens and smoothes the panel 424 so as to further reduce potential registration errors. Next, the cameras 436 determine the location of the registration targets on the panel 424. The targets may be any type of marking, or a hole, or, on multi-layered panels, may be a point located on an earlier layer that is detectable by the cameras 436. Determining the location of a number of targets determines the delta theta rotation error. Next the delta theta rotation error is substantially eliminated by first very slightly retracting the transparent plate 430 via the extenders 432, 434 and then rotating the vacuum table 420 via the pivot 422. The pivot 422 can include a motor with a gearbox or a stepper motor. The gearbox or stepper motor provides a highly accurate position resolution. Alternatively, an eccentric shaft can be used in combination with or in place of the gearbox. The vacuum table 420 can mechanically rotate over a very small angle to substantially remove the delta theta error in the panel 424. Next, the two scale factors in X and Y direction are searched using at least three registration targets. Using a grid system and a dynamic range vision system, the registration process occurs very quickly as described above in FIGS. 2A–3. The X and Y values are output to the imaging section. For example, the X value can be used to modify the panel 424 transport speed and the Y value can be used to modify the scan length and or location of a laser imager.

After the previous panel has completed processing in the next section, the registration sub frame 410 is raised to cause the docking pins 412, 414 to engage the portion 418 of the frame for the image section. In one embodiment, the registration sub frame 410 is raised by increasing the pressure of or otherwise causing the isolators 404, 406 to extend. In an alternative embodiment the registration sub frame 410 is raised by other methods separate from the isolators 404, 406 such as a mechanical lifting device such as a hydraulic or air cylinder, a screw or geared lifting device. In the raised position, the docking pins accurately locate the registration sub frame 410 in a known position relative to the imaging section. Next the grippers 456, 458 grip the panel 424. Optionally, next the cameras 436 can check the location of the targets once again. If any additional delta theta errors are detected, then the grippers 456, 458 release the panel and the vacuum table 420 readjusts to further substantially eliminate the delta theta error as described above. The transparent plate 430 is then retracted away from the panel 424 and the vacuum is released from the vacuum table 420. Optionally, to assist in releasing the panel from the vacuum table 420 and or the transparent plate 430, pressurized air or some other gas or combination of gases can be applied to the vacuum table 420. Then, the vacuum table 420 is lowered or otherwise moved away from the panel 424.

In yet another embodiment, two registration engines can be used, one engine for each side of the panel 424. Each registration engine will be equipped with a transparent plate 430 and cameras 436 such as described above in FIGS. 2A–2D. Both registration systems move toward each other and sandwich the panel 424 to hold it in place. Such a dual sided registration system can provide highly detailed registration information for each side of the panel 424. In such an embodiment, each side of the panel 424 is treated individually and the correct delta theta error correction information for each side is transmitted to the corresponding imaging head in a subsequent imaging section. Such a dual sided registration system can be of great benefit when, for example, a panel 424 is drilled with a small diameter drill and the resulting hole is not precisely straight due to drill run out or some other tolerance or machine wear or operator error. The holes on either side of the panel 424 can be located differently. The error from one side of the panel 424 to the other side could be as great as 15 microns and the imaging section can correct and compensate for such an error.

Figure 4B:
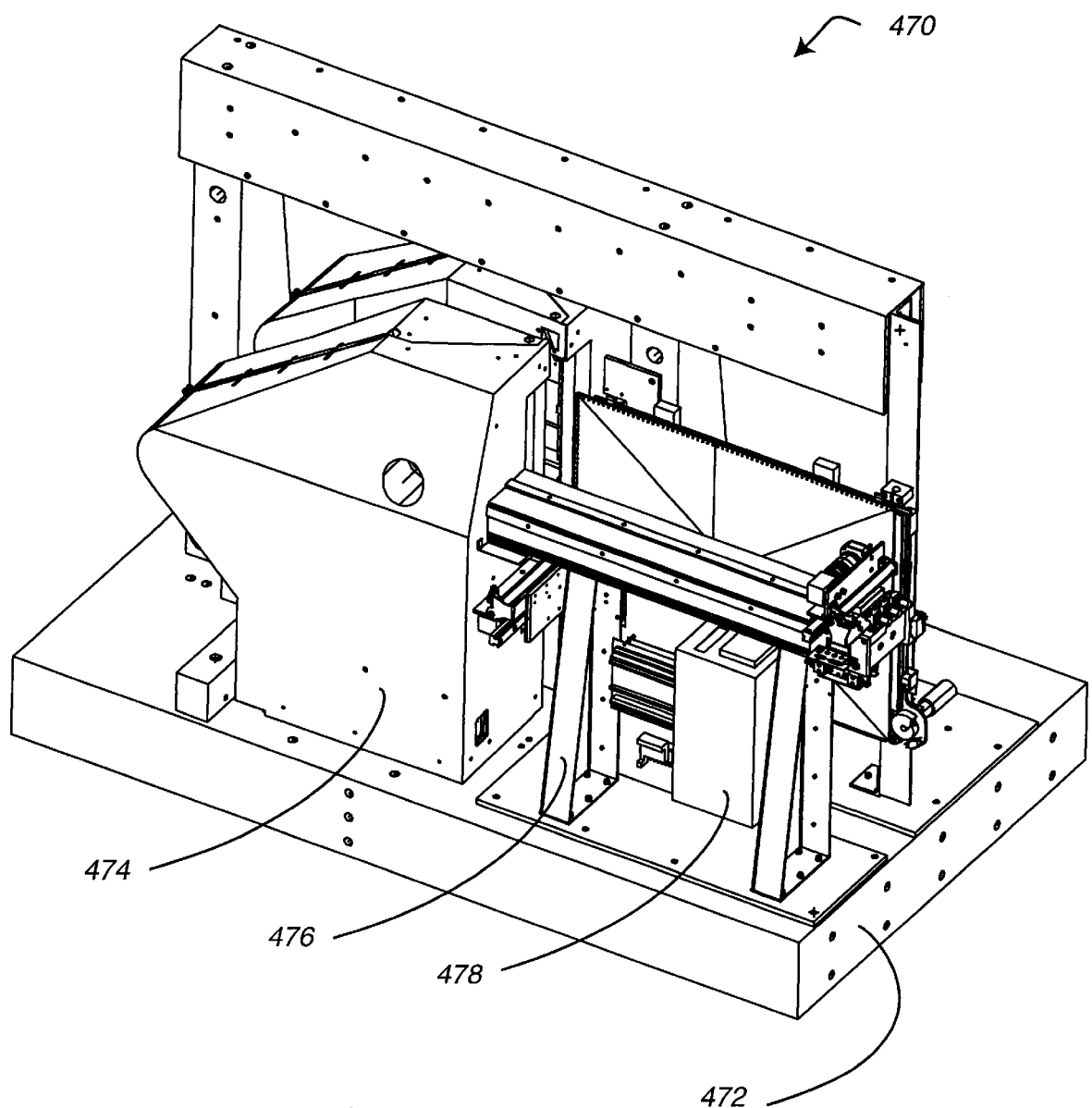
FIG. 4B illustrates another embodiment of the registration section 470 of FIG. 4A.

FIG. 4B illustrates another embodiment of the registration section 470. The registration section 470 includes a foundation slab 472, which is shared by adjoining sections such as an image section 474. A registration sub frame 476 and a registration control system 478 are included in the registration section 470.

Figure 4C:
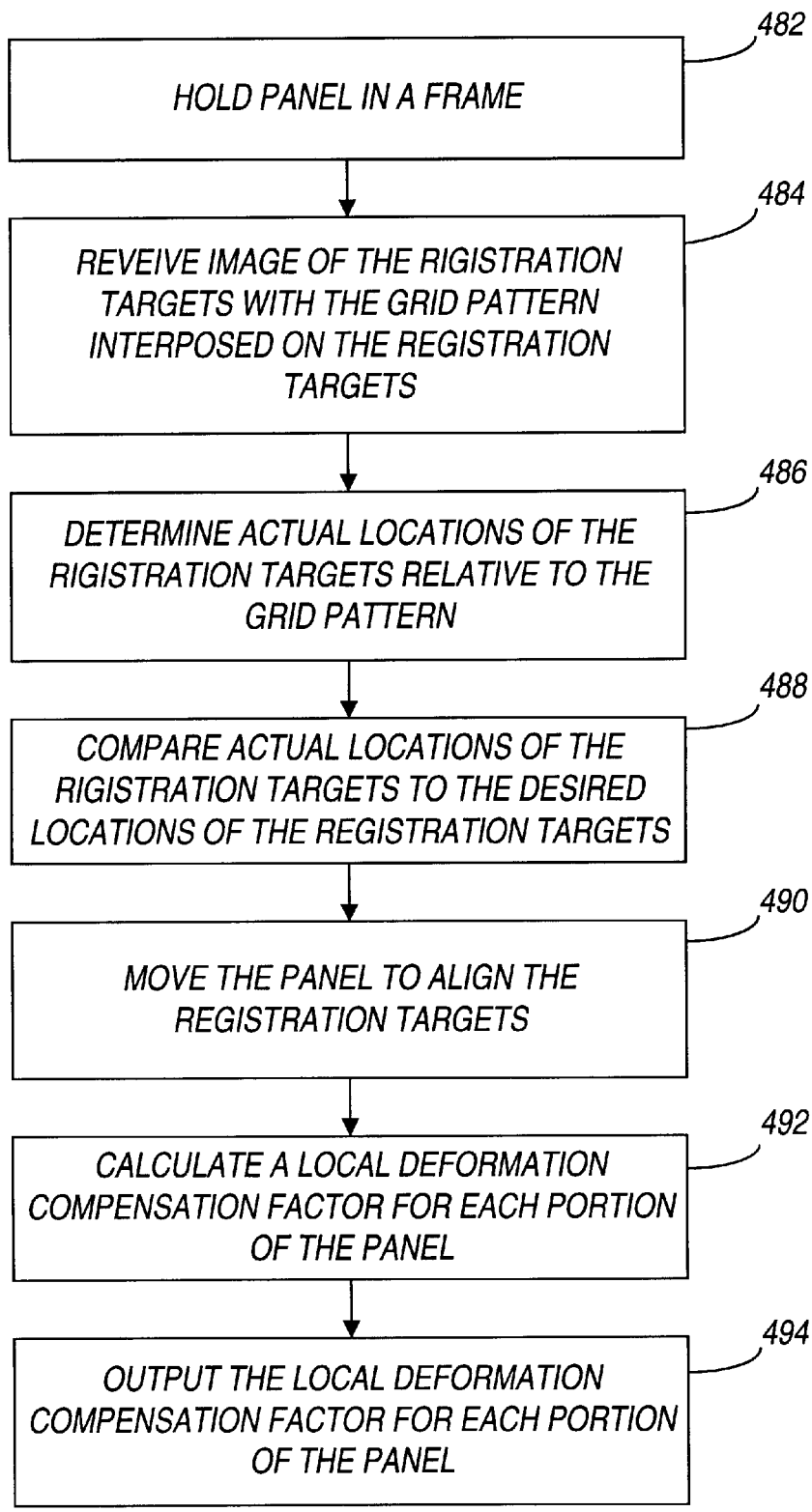
FIG. 4C illustrates a flowchart of the process of one embodiment.

FIG. 4C illustrates a flowchart of the process of one embodiment. First the panel 220 is held in the frame in block 482. The images of the registration targets on the panel are received in block 484. The images also include the pattern 222 interposed on the registration targets. The images are received as described above in FIGS. 2A–3 above. The actual locations of the registration targets relative to the pattern 222 are determined in block 486. The actual locations of the registration targets are then compared to the corresponding desired locations of the registration targets in block 488. The panel 220 is moved to substantially align the registration targets to the desired locations in block 490. The local deformation compensation factor for each portion of the panel 220 is calculated in block 492. The local deformation compensation factor for each portion of the panel 220 is calculated as described in more detail below. The local deformation compensation factor for each portion of the panel 220 is output in block 494 such as to a subsequent imaging process. It should be appreciated that the instructions represented by the blocks in FIG. 4C are not required to be performed in the order illustrated, and that all the processing represented by the blocks may not be necessary to practice the invention.

Figure 5:
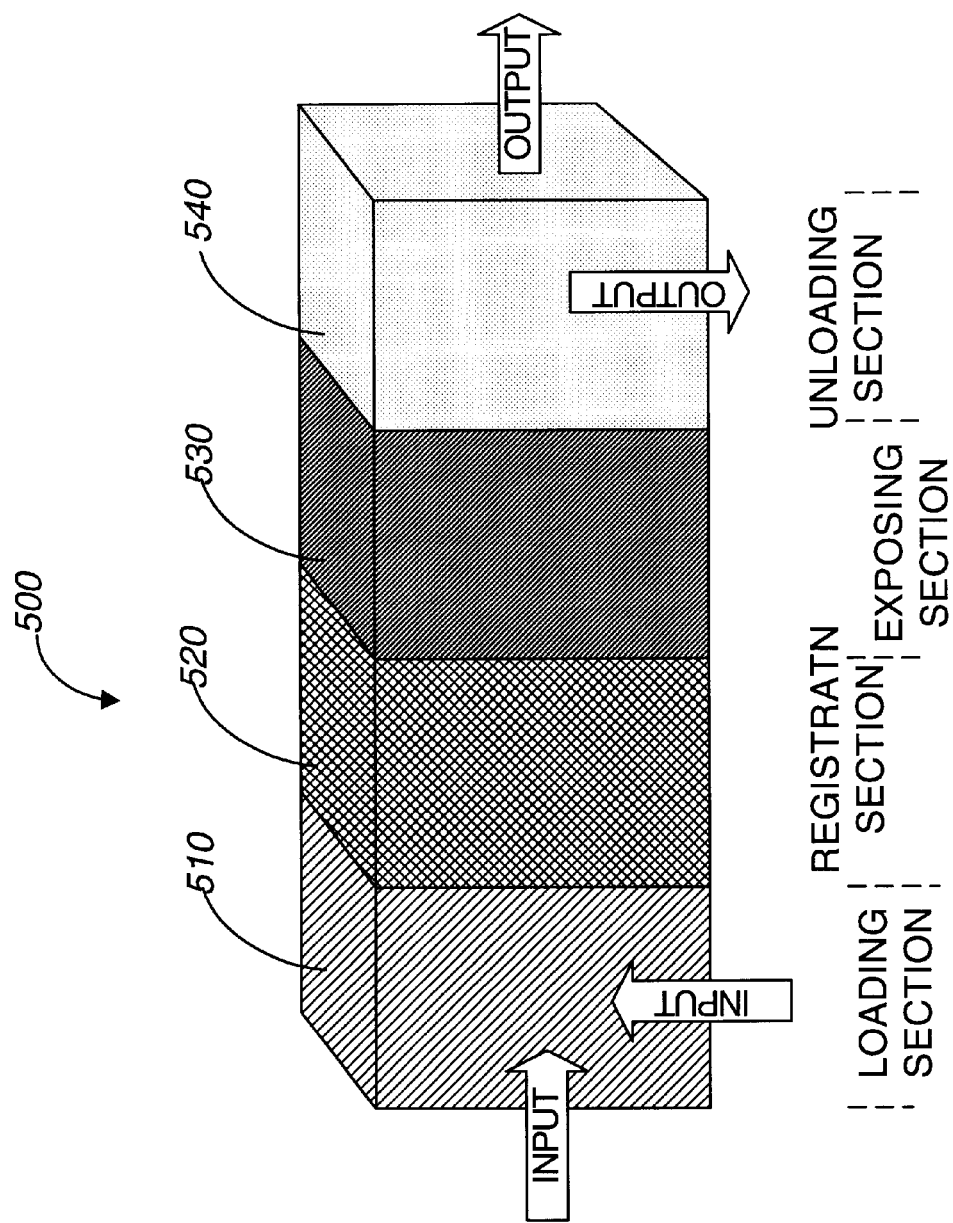
FIG. 5 illustrates a modular view of one embodiment of a laser direct imaging system.

FIG. 5 illustrates a modular view of one embodiment of a laser direct imaging system. The modules include a loading module 510, a registration module 520, an exposing or imaging module 530 and an unloading module 540. The registration module 520 can include a registration section 400 described above. An integrated laser direct imaging system allows multiple processes to be accomplished in parallel. For example at one time the following can be occurring: a first panel is being unloaded in the unloading module 540; a second panel is being imaged in the imaging module 530; a third panel is being registered in the registration module 520; and a fourth panel is being loaded in the loading module 510. This modular, integrated system 500 can allow faster panel throughput. For one embodiment, the panel registration can be divided between the loading module and the registration module. In such an embodiment, the loading module includes a pre-registration section. The pre-registration section aligns at least one corner of a panel before the panel is transferred to the registration module. The pre-registration section is only a coarse alignment and not a fine registration such as described above in the registration engine. Dividing the registration between the loading module and the registration module can further reduce the overall process time for a given panel and thereby increase throughput through the laser direct imaging system.

Figure 6:
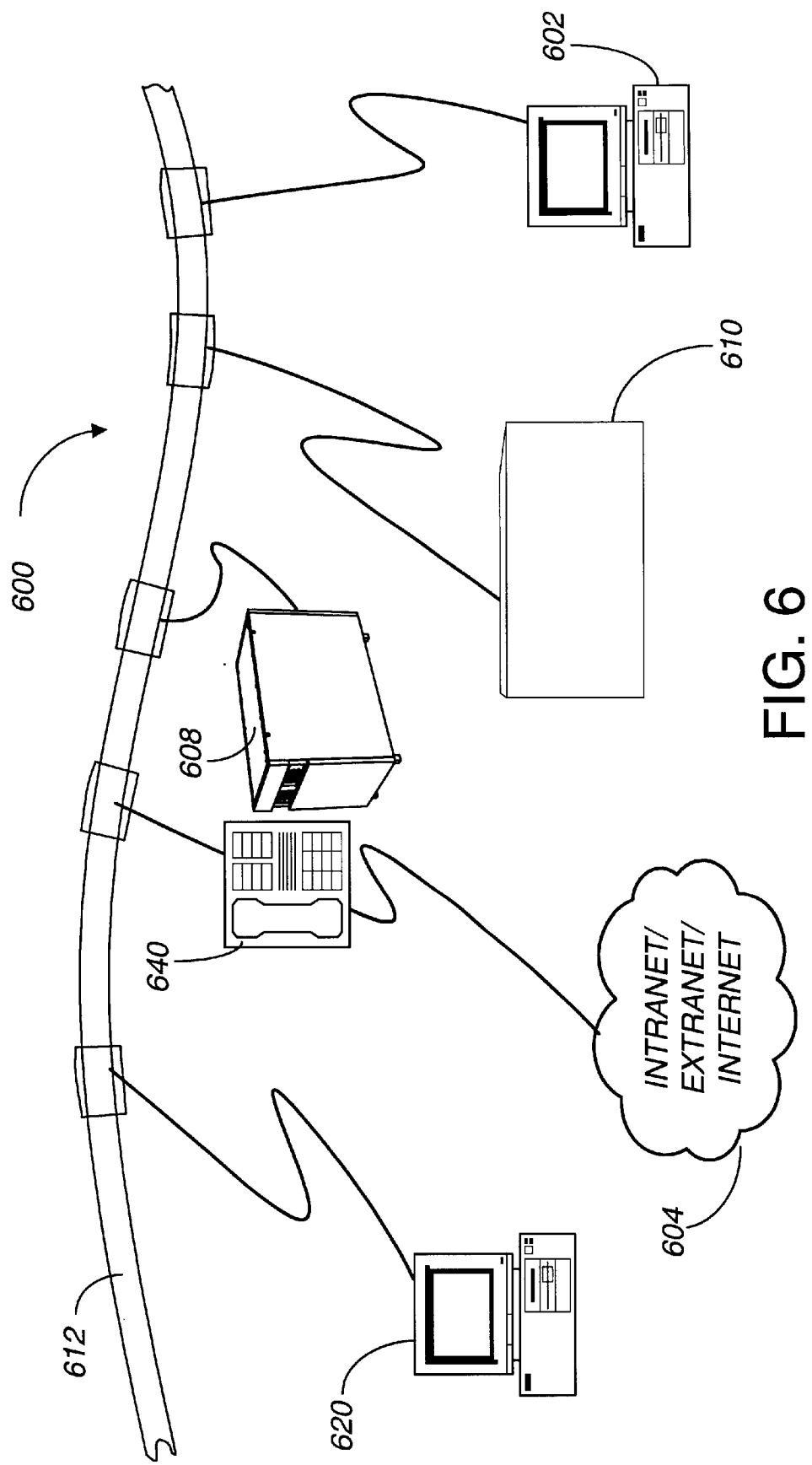
FIG. 6 illustrates an embodiment of a local area network (LAN) 600 in accordance with the present invention.

FIG. 6 illustrates an embodiment of a local area network (LAN) 600 in accordance with the present invention. The LAN 600 includes interconnections between the controller 602 of an automated, flow-through, dual side, laser direct imaging apparatus and the extranet 604. Also connected to the LAN 600 are a raster imaging processing (RIP) bank 608, a main file server to the LDI 610, and a workstation 620. Other workstations and peripheral connections may also be connected to the LAN 600. The extranet 604 can include the Internet. The controller 602 is also linked to the registration engine and receives the image data of the registration targets.

One skilled in the art will immediately appreciate that the invention can be practiced with other computer system configurations, including multiprocessor systems, minicomputers, mainframe computers, and the like. The invention can also be practiced in distributed computing environments where tasks are performed by remote processing devices that are linked through a communications network.

Figure 1:
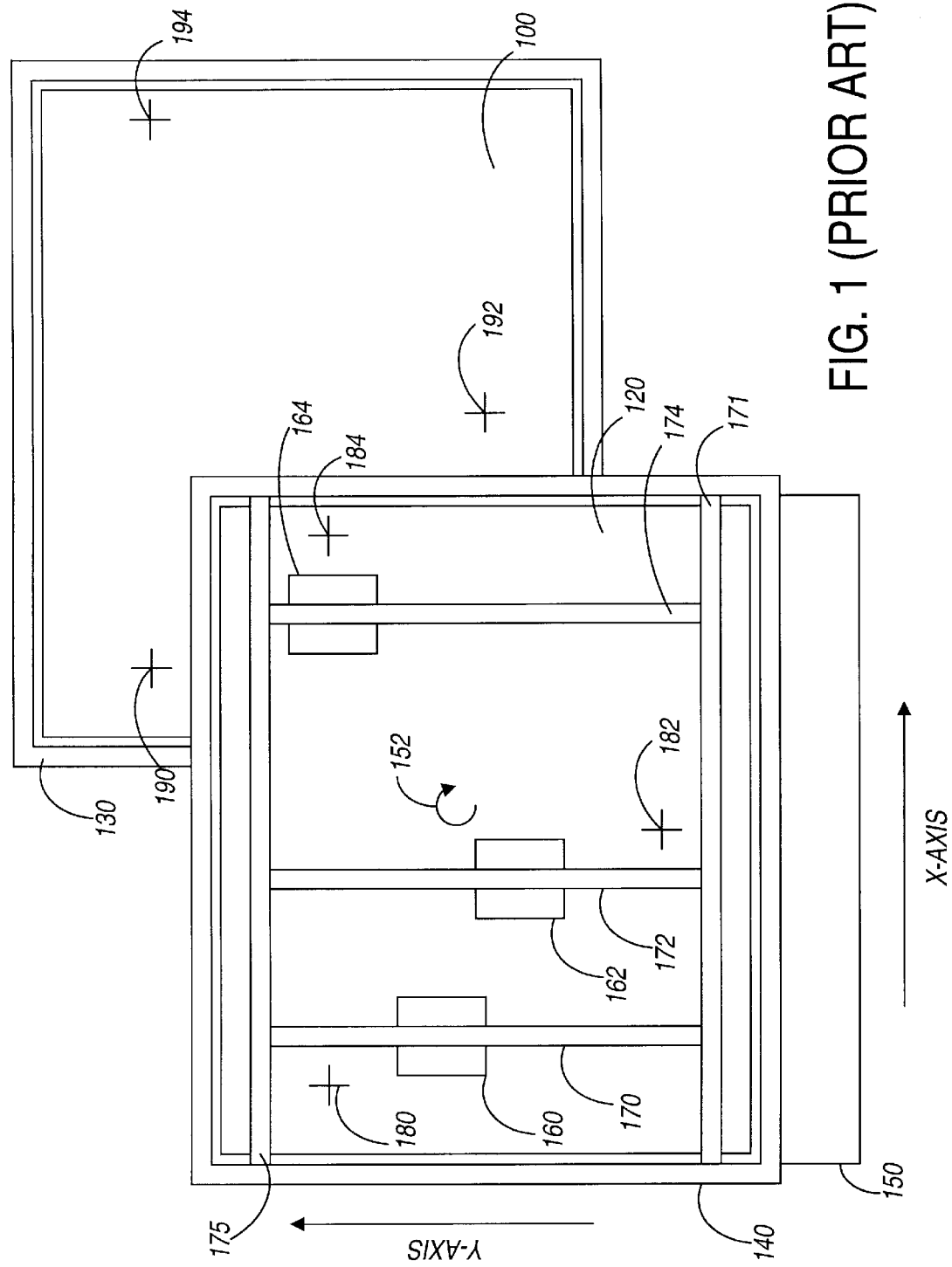
FIG. 1 illustrates a prior-art visual registration system.

The prior-art visual registration system described in FIG. 1 can correct for global misalignment and scaling in the X-axis or Y-axis. A deformation or scaling error is global if the deformation or scaling error is uniform across the entire panel 220. The prior-art visual registration system compensates for any detected misalignment, scaling, deformation or other distortion error by adjusting the entire panel in one direction or rotation as needed. The prior-art visual registration system examined a few registration targets and calculated an average deformation error. Then applied an average deformation error correction to the entire panel 220. For example: Five registration targets are examined. The first registration target had an error of 0.080", the second had an error of 0.020", the third, fourth and fifth registration targets had an error of 0.050". Therefore, the average error was 0.050". 0.050" was then input as an average deformation even though some registration targets had less error and some had more error. The average error correction of 0.050" was then applied to the entire panel 220. The average error correction could be applied in one direction or a rotation or as a scaling error as determined from the directional portions of the error calculations.

To be accurate, an average deformation error must presume a constant deformation error across the entire panel 220. Unfortunately, often the panel 220 is thin and flexible and therefore not always perfectly flat when the panel 220 is processed. Other causes of localized errors are distorted phototools. Therefore, previous operations the panel 220 has been subjected to may not have resulted in a constant deformation across the length and breadth of the panel 220 and only localized misalignment, scaling, deformation or other distortion errors occur. A localized deformation or scaling error is limited to a portion of the panel 220 less than the whole panel 220. The prior-art visual registration system cannot correct or otherwise compensate for a localized misalignment, scaling, deformation or other distortion error.

A local deformation or distortion is detected by first determining the actual locations multiple registration targets as described above. Then the actual locations of the multiple registration targets are compared to the desired location of the registration targets. In one embodiment, the computer that receives the actual image data such as the image 300 of FIG. 3 can accomplish the comparison.

Figure 7:
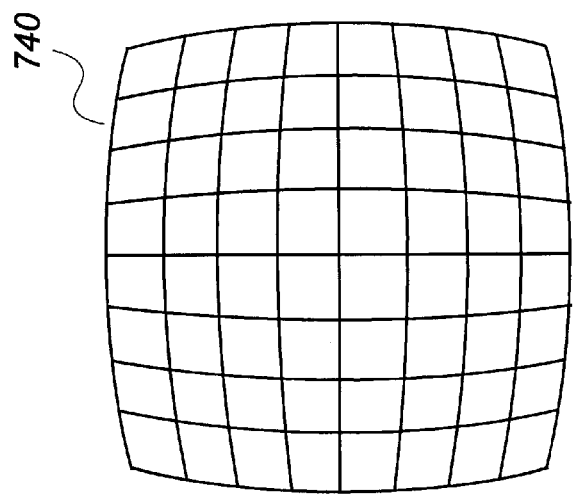
Figure 7:
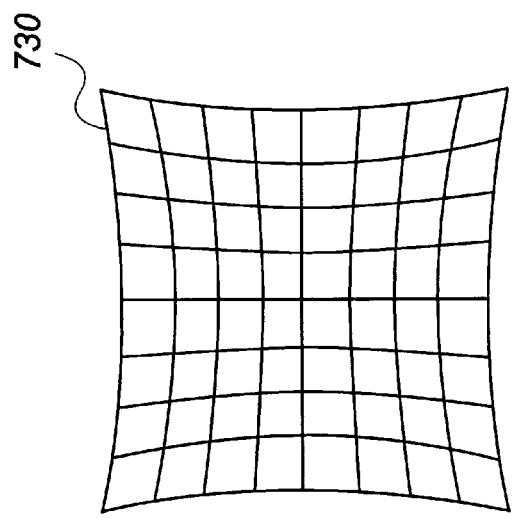
Figure 7:
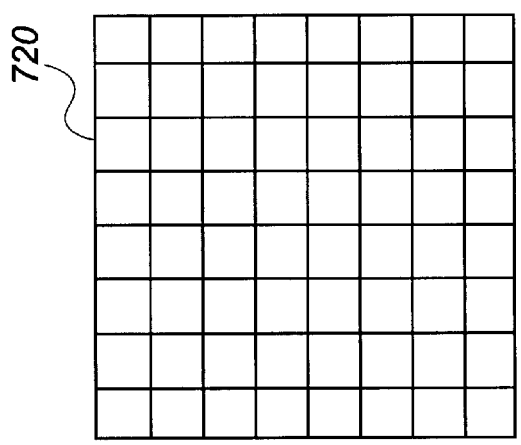

One example of image deformation and compensation is described in Digital Image Processing 2nd ed. (April 1991), by William K. Pratt, published by John Wiley & Sons, Inc, ISBN 0471857661 which is incorporated by reference herein for all purposes. FIG. 7 illustrates examples of types of distortion that can be compensated for under Pratt's methods. An undistorted square pattern 710 and a pincushion distorted pattern 720 and a barrel distorted square pattern 730 are shown. Square samples of distortions are shown for convenience only, the distortion compensation is not limited to square sections or grid patterns.

Figure 8:
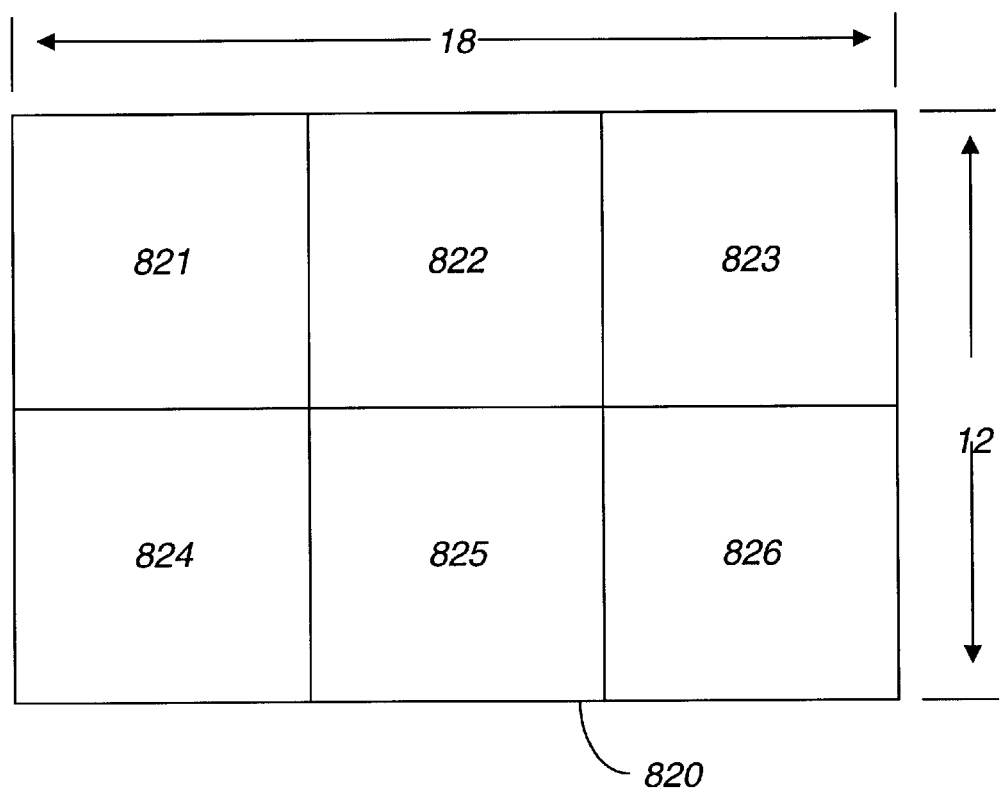
FIG. 8 illustrates an example of a panel with localized distortions.

In one embodiment, the registration engine of FIGS. 2A–2D compensates for localized deformation or distortion by first examining multiple registration targets in each of several portions of the panel 220. The localized deformation or distortion is then identified for each portion of the panel 220. A compensation factor for each localized deformation or distortion is then calculated. Because the localized deformation or distortion only affects a small portion of the entire panel 220, then a global adjustment to the panel is ineffective. Instead, the localized compensation factor for each portion is output for use in a subsequent process such as a laser direct imaging process. FIG. 8 illustrates a simplified example: a 18"×12" panel 820 is divided into six, 6"×6" sections 821, 822, 823, 824, 825, 826. Three or more registration targets in each section 821, 822, 823, 824, 825, 826 are examined and localized distortion is discovered in sections 821 and 825. Sections 822, 823, 824 and 826 are not distorted. A compensation factor is then calculated for each of sections 821–826. The compensation factors for sections 822, 823, 824 and 826 include no correction. The compensation factors for sections 821 and 825 include the corresponding compensation data to correct for the corresponding distortion in each section. The compensation factor for each of the six sections 821, 822, 823, 824, 825, 826 is then output to the next processing section. In this example the next processing section is a laser direct imaging section. The laser direct imaging section is a section that uses a laser to directly "draw" images on the panel. The compensation factor for each section modifies the image drawn on the panel to compensate for the localized distortion. For another example the panel 820 contains several separate PCBs that will be ultimately separated into individual PCBs. For example, each of the six sections 821, 822, 823, 824, 825, 826 could be a separate, smaller PCB that is part of the larger PCB panel 820. Each of the smaller PCBs 821, 822, 823, 824, 825, 826 can be adjusted and modified individually to compensate for localized distortion.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A panel registering method comprising:
holding a panel in a frame wherein the frame includes a transparent plate covering the panel and wherein the transparent plate has a pattern on at least one surface;
receiving an image of each one of a plurality of registration targets on the surface of the panel wherein the image is received through the transparent plate; and
determining an actual location of each one of a plurality of registration targets relative to the pattern.
wherein the received image is a reflected image,
wherein the reflected image is reflected perpendicular to the plane of the panel, and
wherein holding the panel in the frame includes:
creating a first air bearing between the transparent plate and the panel;
creating a second air bearing between the panel and a vacuum plate; and
applying a second vacuum in place of the second air bearing and then applying a first vacuum in place of the first air bearing.

2. The panel registering method as recited in claim 1, further comprising coupling the frame to a subsequent section.

3. The panel registering method as recited in claim 1, further comprising:
gripping the panel in a carrier, wherein the carrier is part of a subsequent section;
releasing the first vacuum and the second vacuum;
recreating the first air bearing and the second air bearing; and
removing the vacuum plate and the transparent plate from the panel.

4. A panel registering method comprising:
holding a panel in a frame wherein the frame includes a transparent plate covering the panel and wherein the transparent plate has a pattern on at least one surface;
receiving an image of each one of a plurality of registration targets on the surface of the panel wherein the image is received through the transparent plate;
determining an actual location of each one of a plurality of registration targets relative to the pattern;
comparing the actual location of each one of the plurality of registration targets with a desired location of each one of the plurality of registration targets; and moving the panel to align each one of the plurality of registration targets in the corresponding desired location, wherein holding the panel in the frame includes:

creating a first air bearing between the transparent plate and the panel;

creating a second air bearing between the panel and a vacuum plate; and applying a second vacuum in place of the second air bearing and then applying a first vacuum in place of the first air bearing, wherein moving the panel includes moving a vacuum plate.

5. A panel registration system comprising:

a frame;

a panel detachably supported in the frame;

a first transparent plate mounted on the frame wherein the first transparent plate covers a first surface of the panel and wherein the first transparent plate has a first pattern on at least one surface; and a first vision system mounted on the frame wherein the vision system can see the first surface of the panel through the first transparent plate, wherein the first vision system includes;

a plurality of cameras;

a plurality of mirrors wherein the cameras are oriented to receive an image of the panel reflected by at least one of the plurality of mirrors; and a controller coupled to the plurality of cameras, and wherein the plurality of cameras are movable, and wherein the location of each one of the plurality of cameras is determined by a portion of the first pattern in the image received in the camera and coupled to the controller.

6. A panel registration system comprising:

a frame;

a panel detachably supported in the frame;

a first transparent plate mounted on the frame wherein the first transparent plate covers a first surface of the panel and wherein the first transparent plate has a first pattern on at least one surface;

a first vision system mounted on the frame wherein the vision system can see the first surface of the panel through the first transparent plate;

a base coupled to the frame wherein the base can be lowered and extended; and a rotating vacuum plate, wherein the panel is located between the first transparent plate and the vacuum plate, wherein the first vision system includes:

a plurality of cameras;

a plurality of mirrors wherein the cameras are oriented to receive an image of the panel reflected by at least one of the plurality of mirrors; and a controller coupled to the plurality of cameras.

7. The panel registration system as recited in claim 6, further comprising:

a rotating mechanism attached to the vacuum plate and coupled to the controller.

8. A panel registration system comprising:

a frame;

a panel detachably supported in the frame;

a first transparent plate mounted on the frame wherein the first transparent plate covers a first surface of the panel and wherein the first transparent plate has a first pattern on at least one surface;

a first vision system mounted on the frame wherein the vision system can see the first surface of the panel through the first transparent plate;

a second transparent plate oriented oppositely from the first transparent plate, wherein the second transparent plate covers a second surface of the panel and wherein the second transparent plate has a second pattern on at least one surface and wherein the panel is held between the first transparent plate and the second transparent plate;and a second vision system mounted on the frame wherein the second vision system can see the second surface of the panel through the second transparent plate, wherein the second vision system registers the second surface of the panel independent from the registration of the first surface of the panel.

* * * * *